310-369 SR

XR 3,872,411

United States Patent [19]

Watanabe et al.

[11] 3,872,411

[45] Mar. 18, 1975

[54] QUARTZ CRYSTAL RESONATOR AND A METHOD FOR FABRICATION THEREOF

[75] Inventors: Takao Watanabe; Akira Kohchi; Toshinobu Fujii, all of Tokyo, Japan

[73] Assignee: Kabushiki Kaisha Meidensha, Tokyo, Japan

[22] Filed: Nov. 10, 1972

[21] Appl. No.: 305,363

[30] Foreign Application Priority Data

Nov. 17, 1971 Japan .............................. 46-92274

[52] U.S. Cl. .................... 333/72, 29/25.35, 310/9.5, 310/9.6, 310/9.8

[51] Int. Cl. ..... H03h 9/18, H01v 7/00, H04r 17/10

[58] Field of Search ............ 333/72, 30 R; 29/25.35; 310/9.4, 9.5, 9.6, 9.7, 9.8

[56] References Cited

UNITED STATES PATENTS

| | | | |
|---|---|---|---|
| 3,222,622 | 12/1965 | Curran et al. | 333/72 |
| 3,363,119 | 1/1968 | Koneval et al. | 310/9.4 X |
| 3,384,768 | 5/1968 | Shockley et al. | 310/9.5 |
| 3,401,276 | 9/1968 | Curran et al. | 333/72 X |
| 3,576,453 | 4/1971 | Mason | 310/8.2 |
| 3,585,418 | 7/1969 | Koneval | 333/72 X |
| 3,683,213 | 8/1972 | Staudte | 310/9.6 |
| 3,694,677 | 9/1972 | Guttwein | 310/9.6 |

*Primary Examiner*—James W. Lawrence
*Assistant Examiner*—Marvin Nussbaum
*Attorney, Agent, or Firm*—Hans Berman; Kurt Kelman

[57] ABSTRACT

A quartz crystal resonator resonating in a thickness shear mode of vibration at an increased frequency is disclosed, the resonator including a quartz crystal plate which is formed with recesses on both sides thereof for receiving therein central and lead electrodes so that the spurious response of the plate can be suppressed.

7 Claims, 11 Drawing Figures

QUARTZ CRYSTAL RESONATOR AND A METHOD FOR FABRICATION THEREOF

The present invention relates generally to quartz crystal filters and has its particular reference to a quartz crystal resonator to form part of a quartz crystal filter of a so-called hybrid type and further to a method of fabricating such a quartz crystal resonator.

The quartz crystal filter of the hybrid type is generally made up of a quartz resonator and other usual circuit elements such as induction coils and capacitors cooperating with the resonator and thus provides various useful performance characteristics resulting from the highly stabilized resonance frequencies, and sufficiently large Q-factors which are available in the quartz resonator.

In spite of such useful performance characteristics of the prior art quartz crystal resonator, a problem has thus far been encountered in that the frequency spectrum of the quartz crystal resonator involves sub-resonance frequency components other than main resonance frequency components desired. Such sub-resonance frequency components bring about a spurious response to the quartz crystal resonator, resulting in substantial impairment of the performance characteristics of the quartz crystal filter. Various attempts have therefore been made with a view to suppressing the spurious response of the quartz crystal resonator and accordingly to provide improved performance characteristics of the quartz crystal filter, none of such attempts having, however, been fully successful.

Of the various types of quartz crystal resonators which are presently in common use, the quartz crystal resonators of the character which vibrate or oscillate in thickness shear modes are predominantly used in the quartz crystal filters with relatively high frequency ranges by reason of their congrudus temperature characteristics, Q-factors, satisfactory shock resistant natures and high workability. The present invention is specifically directed to the quartz crystal resonator of this type.

It is accordingly an important object of the present invention to provide an improved quartz crystal filter of the hybrid type.

It is another important object of the invention to provide a quartz crystal filter having an improved quartz crystal resonator of the particular character which is adapted to vibrate in a thickness shear mode.

It is still another important object of the invention to provide an improved quartz crystal resonator of the character which is capable of vibrating in a thickness shear mode in a relatively high frequency range.

It is still another important object of the invention to provide an improved quartz crystal resonator which is substantially free from spurious responses.

It is still another important object of the invention to provide an improved quartz crystal resonator which is operable in an increased frequency range which may be even higher than 15MHz.

It is still another important object of the invention to provide an improved quartz crystal resonator in which the spurious response is suppressed to a satisfactory extent and nevertheless deterioration of the temperature and aging characteristics of the quartz resonator as would usually invited by the suppression of the spurious response can be practically avoided.

Yet, it is another important object of the present invention to provide a method of fabricating the quartz crystal resonator of the described nature in a simple and economical manner and which is accordingly readily put into practice on a commercial basis.

The quartz crystal resonator to accomplish these and other objects of the present invention comprises a quartz crystal plate of a predetermined density, the crystal plate having two oppostie major surfaces which are respectively formed with recesses of a common predetermined depth, a pair of electrodes having a common predetermined density and a common prdetermined thickness and respectively received in the recesses formed in the major surfaces of the crystal plate, and a pair of lead plates which are respectively mounted on the major surfaces of the crystal plate for connection to the associated electrodes and which extend in diametrically opposed directions, wherein the ratio of the depth of the recesses to the thickness of the electrode is larger than the ratio of the density of the electrodes to the density of the crystal plate. The lead plates may preferably be respectively received in the recesses in the opposite major surfaces of the quartz crystal plate. These recesses may be patterned identically with each other, where desired. The method adapted to fabricate the quartz crystal resonator having the above described construction comprises the steps of preparing a quartz crystal plate, coating two opposite principal surfaces of the crystal plate with a photo-resist, pre-baking the resultant crystal plate, superposing on each of the major surfaces of the crystal plate a substantially transparent thin film carrying thereon a desired opaque pattern, irradiating the coating of the photo-resist through the pattern carrying transparent thin film with light for photocuring the photo-resist coating in conformity to the opaque pattern, immersing the crystal plate with the photo-resist coating in a solution dissolving the photoresist, post-baking the resultant crystal plate, immersing the post-baked crystal plate in an etchant for etching the principal surfaces of the plate, removing the photocured photo-resist from the major surfaces of the crystal plate and mounting a pair of electrodes and a pair of lead plates on etched portions of the major surfaces.

The natures and advantages of the quartz crystal resonator and the method of fabricating the same will become more apparent from the following description of the invention as taken in conjunction with the accompanying drawings, in which.

Figures 1A, 1B, 1C, 3A, 3B, 3C, 4A, 4B, 4C:
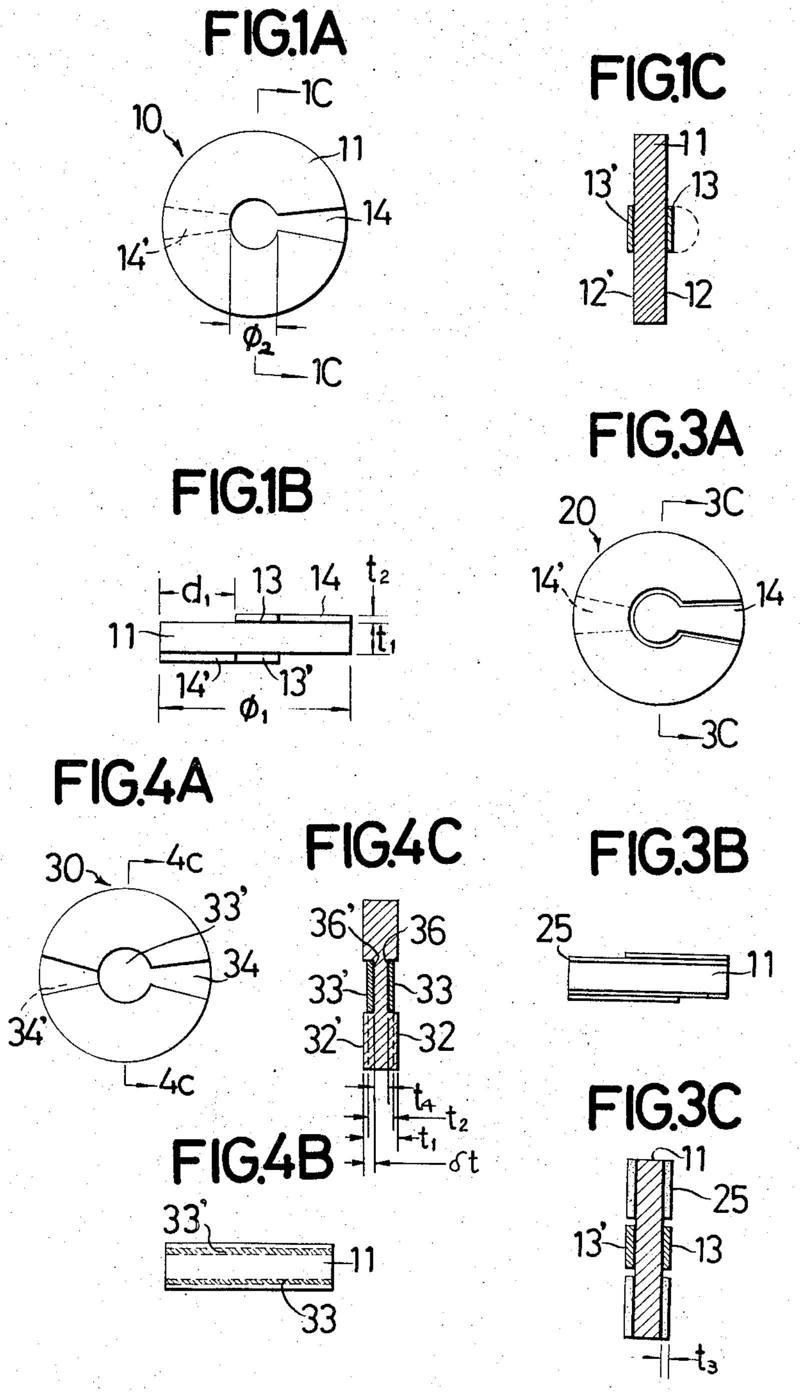
FIG. 1A is a schematic top plan view of a representative example of the prior art quartz crystal resonator.
FIG. 1B is a side end view of the quartz crystal resonator shown in FIG. 1A.
FIG. 1C is a section taken on a line 1C—1C in FIG. 1A.
FIGS. 3A to 3C are views respectively similar to FIGS. 1A to 1C but shows another typical example of the prior art quartz crystal resonator.
FIG. 4A is a schematic top plan view showing a preferred embodiment of the quartz crystal resonator according to the present invention.
FIG. 4B is a side end view of the quartz crystal resonator shown in FIG. 4A.
FIG. 4C is a cross sectional view taken along a line 4C—4C of FIG. 4A.

Reference will now be made to the drawings, first concurrently to FIGS. 1A and 1C which illustrate a typical example of the prior art quartz crystal resonator which is generally designated by reference numeral 10. The present invention is directed to the quartz crystal rosonator of the type resonating at relatively high frequencies in a thickness shear mode and thus the quartz crystal resonator herein shown is assumed as being of such type. The quartz crystal resonator 10 comprises a quartz crystal plate 11 in a disc form having opposite parallel major surfaces 12 and 12' having substantially the same area. The quartz crystal plate 11 has a thickness $t_1$ and a diameter $\phi_1$ as indicated in FIG. 1B. It is, in this instance, well known in the art that an AT-cut or BT-cut quartz crystal plate, which resonates in a fundamental or odd-number-order overtone mode of the thickness shear vibrations, is particularly suitable for use in the quartz crystal resonator which is operable in a relatively high frequency range because of its congruous temperature characteristics, Q-factor, shock-resistant nature and workability as previously pointed out. The quartz crystal plate 11 in the shown example is assumed to be of the AT-cut or the BT-cut. The quartz crystal plate 11 carries centrally on its principal surfaces 12 and 12' a pair of electrodes 13 and 13', respectively, of generally circular configurations. These central circular electrodes 13 and 13' have substantially equal diameters, $\phi_2$, substantially equal thickness $t_2$ as indicated in FIG. 1B and are formed of highly conductive metal such as for example silver, aluminum, copper or gold and is applied to the major surfaces 12 and 12', respectively, of the quartz crystal plate 11 by a suitable chemical or electrochemical technique such as the vacuum evaporation method or electroplating method.

A pair of elongated metallic lead plates 14 and 14' are mounted on the major surfaces 12 and 12' and are connected to the circular electrodes 13 and 13', respectively. These lead plates 14 and 14' extend in diametrically opposed directions from the central circular electrodes and terminate at the perimeters of the major surfaces 12 and 12', respectively, of the quartz crystal plate 11. As best seen in FIG. 1B, the elongated lead plates 14 and 14' are herein assumed to have the same length $d_1$ in the radial directions of the principal surfaces 12 and 12' or, in other words, the central circular electrodes 13 and 13' are smaller in radius a distance $d_1$ than the major surfaces 12 and 12', respectively, of the quartz crystal plate 11. The elongated metal lead plates 14 and 14' serve not only to provide electrical connections of the circular electrodes 13 and 13', respectively, to external circuit elements (not shown) forming part of the quartz crystal filter but to provide mechanical reinforcement to the quartz crystal plate 11 in cooperation with usual support structures therefor.

Whereas, it is known that the spurious responses which are brought about in the thickness shear modes of vibrations of the quartz crystal resonators in general are broken down to the following three major categories:

a. The contour high-order mode responses which are dictated by the specific contours and/or external dimensions of the quartz crystal plates forming the resonator units;
b. The inharmonic responses;
c. The miscellaneous responses which are caused by mechanical and/or thermal couplings between the elements building up the quartz crystal resonators. (The spurious responses of this particular nature will be disregarded or deemed as negligible because they are rather immaterial for the understanding of the benefits of the quartz crystal resonator herein disclosed.)

It is, on the other hand, also known that, in the quartz crystal resonator 10 of the construction shown in FIGS. 1A to 1C, the main resonance frequency of the quartz crystal plate 11 lies in a relatively high frequency range so that the ratio of the diameter $\phi_1$ to the thickness $t_1$ of the quartz crystal plate must be greater than 40, thus $\phi_1/t_1>40$. If, therefore, the distance $D_1$ between the perimeters of the quartz crystal plate 11 and the central circular electrodes 13 and 13' is so selected that the ratio of the distance $d_1$ to the thickness $t_1$ is larger than 15, thus $d_1/t_1>15$ and at the same time the thickness $t_2$ of the circular electrodes 13 and 13' is so selected as to provide a given quantity of mass of the electrodes, then the mechanical energy causing the resonance vibrations of the quartz crystal plate 11 is concentrated in that region of the quartz crystal plate which intervenes between the two circular electrodes 13 and 13' as indicated by a dotted curve in FIG. 1C. This means that the spurious response of the category (a) above defined can be suppressed advantageously by proper selection of the locations and thickness of the central circular electrodes 13 and 13'.

If, apart from this, the radial distance $d_1$ between the perimeters of the quartz crystal plate 11 and the central circular electrodes 12 and 12' and the thickness of the crystal plate 11 are so selected as to provide the above mentioned relation $d_1/t_1$°15, the inharmonic response or the spurious response of the category (b) will be dependent upon the ratio of the diameter $\phi$ of the central circular electrodes 13 and 13' to the thickness $t_1$ of the quartz crystal plate 11 and upon a ratio R of the quantity of mass per unit area of the two circular electrodes 13 and 13' to the quantity of mass per unit area of the quartz crystal plate 11, the ratio R being expressed as $$R = 2\rho_2 . t_2 / \rho_1 . t_1, \qquad \text{Eq. 1}$$

where $\rho_1$ is the density of the quartz crystal plate 11 and $\rho_2$ is the density of each of the circular electrodes 13 and 13'.

As is well known in the art, a $p$th order natural frequency $fo$ (where $P$ is an odd interge and may be 1, 3, 5, . . . ) of the thickness shear mode of vibrations of the quartz crystal plate is dictated by the thickness $t_1$ of the plate and is given by $$fo = P/2t_1 \sqrt{C_{66'} / \rho_1}, \qquad \text{Eq. 2}$$

where $C_{66'}$ is a compensated stiffness of the quartz crystal plate 11. On the other hand, the natural frequency fe of the thickness shear mode of vibrations occurring intermediate between the central circular electrodes 13 and 13' can be approximated by an equation $$fe = P/2t_1(1 + R)\sqrt{C_{66}'/\rho_1}.$$

Eq. 3

If, in this instance, the frequency f is normalized by the above defined frequency *fo* and is thus represented by $$\Omega = f/fo,$$

Eq. 4 then a frequency drip, , $\Delta$, in the natural response frequency of the quartz crystal plate 11 is given by $$\Delta = (fo - fe)/fo = 1 - \Omega_e.$$

Eq. 5

It therefore follows that the Belevitch parameter $\Psi$ is written in the form of $$\Psi = \Omega - P \cdot \Omega_e / P(1 - \Omega_e).$$

Eq. 6

It is known that one or more inharmonic modes of vibrations take place in the region of the quartz crystal plate 11 between the circular electrodes 13 and 13' at frequencies with which the Belevitch parameter assumes a value of zero to 1 by reason of the known energy trapping phenomenon. Various relations between the Belevitch parameter $\Psi$ and the value $P(\phi_2/t_1)\sqrt{\Delta}$ are demonstrated in the graph of FIG. 2, wherein the axis of ordinate represents the Belevitch parameter and the axis of abscissa stands for the value of $P(\phi_2/t_1)\sqrt{\Delta}$. The various characteristic curves indicated in FIG. 2 have been obtained by putting into Eq. 6 the results of the experiments conducted with an ideal quartz crystal resonator using a quartz crystal plate having an infinite length along its X-axis and a finite length along its Z-axis and electrodes of a certain thickness mounted on both major surfaces of the quartz crystal plate and through analyses made into the energy trapping vibrations of such an ideal quartz crystal plate. The numerals represented by *l* and *m* within parentheses on the right-hand side of the graph are indicative of the numbers of poles in the X- and Y-axes, respectively, of the inharmonic modes of vibrations. It is, in this instance, noted that the inharmonic mode of vibrations is also exhibited in a region indicated by reference character A in the graph of FIG. 2 although such is not herein tabulated for the simplicity of illustration. It will be observed from the curves of FIG. 2 that the energy level of the inharmonic mode of vibrations decreases as the Belevitch parameter increases and is almost dampened out as the Belevitch parameter approaches 1.0. It may be also mentioned that, when both of the numbers *l* and *m* are odd as in the case of the mode with (1, 3) or (3, 1), then symmetrical inharmonic mode of vibrations will result and, when both the numbers *l* and *m* are even, anti-symmetrical inharmonic modes of vibration will take place. The anti-symmetrical mode of vibration is not brought about in the quartz crystal resonator of the construction shown in FIGS. 1A to 1C in which the electrodes on both sides of the quartz crystal plate are identical to each other with respect to the shape, size, quantity of mass and position relative to the quartz crystal plate. Where, however, the electrodes on the quartz crystal plate differ in geometry and/or quantity of mass from each other, the vibrations will be brought about in the antisymmetrical inharmonic mode. Such an anti-symmetrical inharmonic mode of vibrations is less intense than the symmetrical inharmonic mode of vibration, as is well known in the art.

Figure 2:
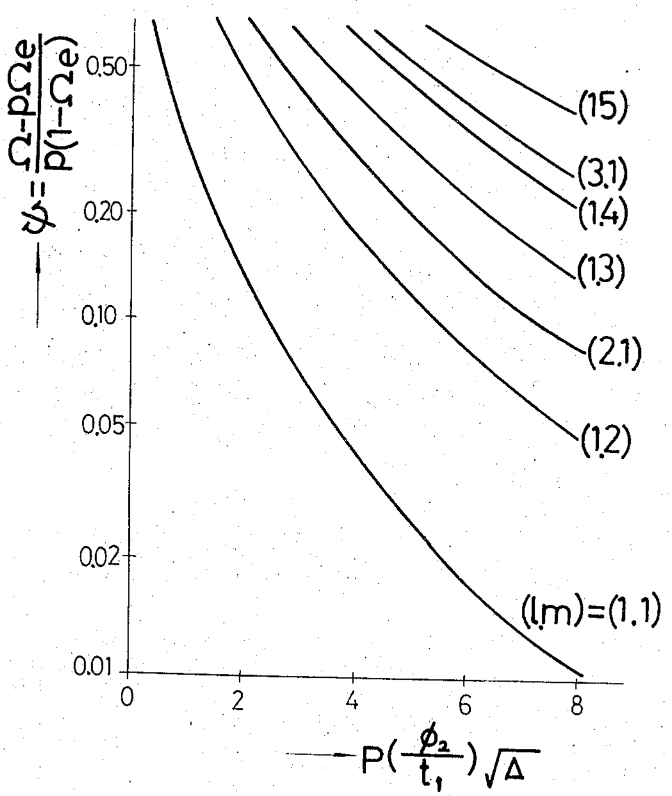
FIG. 2 is a graph explaining a condition in which an inharmonic mode of vibrations is brought about in the quartz crystal resonator of FIGS. 1A to 1C.

It will now be understood from the foregoing analysis that the inharmonic mode of vibrations, viz., the spurious response of the category (*b*) previously mentioned can be prevented from appearing in the quartz crystal resonator if the two electrodes 13 and 13' on the major surfaces 12 and 12', respectively, of the quartz crystal plate 11 are in strict agreement with each other in respect of their quantities of mass, contours, dimensions and positions relative to the quartz crystal plate 11. In consideration, moreover, of the odd-number-order inharmonic mode of vibrations, particularly the (1, 3) mode as indicated in the graph of FIG. 2, it is important that the quartz crystal resonator be constructed in such a manner that the following relation is maintained:

$$P(\phi_2/t_1)\sqrt{\Delta}<2.$$

From this relation it is apparent that the contour high-order mode and inharmonic response of the quartz crystal resonator in previously mentioned categories (a) and (b) above can be suppressed most effectively if the outside diameter $\phi_2$ of the crystal circular electrodes 13 and 13' and the frequency drop $\Delta$ are sufficiently small. This frequency drop $\Delta$ is written in consideration of Eqs. 1, 2, 3 and 5 in the form $$\Delta = R/(1 + R),$$

Eq. 7 so that, for minimizing the frequency drop $\Delta$, it suffices that the ratio R be minimized.

Where, by way of example, a quartz crystal resonator is constructed with use of an AT-cut quartz crystal plate having a fundamental resonance frequency of 20MHz and a thickness $t_1$ of 83 microns and circular electrodes of silver and a thickness $t_2$ of 0.1 micron, then the ratio *R* equals 0.0095 from Eq. 1 and accordingly the frequency drop $\Delta$ equals 0.0095 from Eq. 7 because the densities $\tau_1$ and $\tau_2$ of the quartz and silver are 2.65 and 10.50 grams per $cm^3$, respectively. If the fundamental frequency of the quartz crystal resonator is used as the resonance frequency thereof, the value *P* is 1 so that the diameter $\phi_2$ of the circular electrodes should be smaller than 0.57 mm from the above mentioned inequality.

It will now be apparent from this particular example of the prior art quartz crystal resonator that the diameter of the electrodes on the quartz crystal plate should be reduced in proportion as the resonance frequency or the order of harmonic of the resonator increases. Reduction in the diameter of the electrodes, however, gives rise to increase in impedance of the quartz crystal resonator and thus it becomes necessary to have the quartz crystal filter to be constructed to provide an increased impedance in its entirety. Apparently this is objectionable from all practical points of view. A useful expedient to avoid such a difficulty will be to maintained the diameter $\phi_2$ of the electrodes unchanged and to set the frequency drop $\Delta$ and accordingly the ratio R to relatively small values through use of such electrodes as are formed of a material having a relatively low density such as for example aluminum the density $\rho_2$ of which is 2.69 grams per $cm^3$. Reducing the thickness $t_2$ of the electrodes of such material will further contribute to achieving the purpose. Where the quartz crystal resonator is required to operate at increased resonance frequencies, such as expedient as described above is actually unfeasible in view of the various practical restrictions, arising from the specific properties of the materials available, techniques for applying the electrodes on the quartz crystal plate and control of the stability and thickness of the metals as the electrodes. Since, moreover, the resistivity of the electrodes increases abruptly and at the same time an unwanted thin-film effect is brought about when the thickness of the electrodes is reduced beyond a certain limit, reduction of the thickness $t_2$ is objectionable in the quartz crystal resonators of the characters which are intended for operation in high frequency ranges.

To provide a solution to these problems, an advanced version of quartz crystal resonator has been proposed and placed on practical use, an example of such a resonator being shown in FIGS. 3A to 3C. This quartz crystal resonator, generally designated by reference numeral 20, is constructed essentially similarly to the quartz crystal resonator 10 of the construction illustrated in FIGS. 1A to 1C and therfore corresponding elements of the two resonants are denoted by like reference numerals. The quartz crystal resonator 20, however, differs from the previously described resonator 10 in that coatings 21 and 21' of a dielectric material such as for example silica ($SiO_2$) are applied typically by a vacuum evaporation method on those portions of the opposite major surfaces 12 and 12', respectively, of the quartz crystal plate 11 which are exposed to the outside, viz., the portions on which the central circular electrodes 13 and 13' and the elongated electrode plates 14 and 14' are absent. If, in this instance, the dielectric coatings 21 and 21' have a density $\rho_3$ and a thickness $t_3$, then the ratio $R'$ of the quantity of mass of the two coatings 21 and 21' to the quantity of mass of the quartz crystal plate 11 is given by an equation $R' = (2\rho_3.t_3)/(\rho_1.t_1)$ so that, in consideration of Eq. 3, the Pth order natural resonance frequency $fo'$ of the quartz crystal resonator 20 can be written in tne form $$fo' = P/2.t_1(1 + =R').\ \sqrt{C_{66'}\ /\rho_1}\ .$$

Eq. 8

Thus, the frequency drop $\Delta'$ resulting from the existence of the electrodes 13 and 13' on the quartz crystal plate 11 is expressed as $$\Delta' = (R - R')/(1 + R).$$

Eq. 9

As a consequence, the effect which is achieved by the provision of the dielectric coatings 21 and 21' may be evaluated as follows:

$$\sqrt{\Delta'/\Delta} = \sqrt{1 = R'/R} = \sqrt{1 - \rho 3.t_3/\rho 2 \cdot t_2}.$$

Eq. 10

This desirable effect is, however, offset by a significant decrease in the Q-factor related to the main resonance frequency and deterioration of the temperature characteristics of the quartz crystal resonator due to the coexistence of the material foreign to the quartz crystal plate. As to the deterioration of the temperature characteristics, it is pointed out that the temperature characteristics curve of a cubic form which is dependent upon the cut angle of the quartz crystal plate varies broadly as a result of the mounting of the dielectric layers on the quartz crystal plate. In addition to these problems, difficulties are experienced in controlling the thickness and uniformity of the dielectric coatings.

The quartz crystal resonator proposed by the present invention is free from all of the above mentioned drawbacks which are inherent in the prior art quartz crystal resonators while the spurious responses such as the contour high order mode responses resulting from the specific external configuration of the quartz crystal plate and the ingarmonic response are effectively suppressed. The spurious response is suppressed in the quartz crystal resonator according to the present invention on principles dictated by Eqs. 1 and 8 and without restrictions arising from the limitations of the values $\phi_2$ and $\Delta$ which are peculiar to the resonator operating in a relatively high frequency range. A preferred embodiment of the quartz crystal resonator to achieve these purposes is illustrated in FIGS. 4A to 4C.

The quartz crystal resonator, generally designated by reference numeral 30, is adapted to operate in a thickness shear mode of vibrations as previously mentioned and thus includes a substantially circular quartz crystal plate 31 having opposite major surfaces 32 and 32'. This quartz crystal plate 31 is of an AT-cut or BT-cut configuration having its major surfaces 32 and 32' inclined from the crystallographic axis of the plate through angles which are suitable for achieving desired temperature characteristics. The diameter and thickness of the quartz crystal plate are assumed to be $\phi_1$ and $t_1$, respectively, while the density thereof assumed to be $\rho_1$. It is, in this instance, important that the thickness $t_1$ of the quartz crystal plate 31 be so selected as to satisfy the condition of Eq. 2.

The quartz crystal plate 31 has formed in its opposite major parallel surfaces recesses 36 and 36', respectively, having an identical contour and a depth $\delta t$ so that the quartz crystal plate 31 has a reduced thickness $t_4$ at its section coextensive with the recesses 36 and 36'. These recesses 36 and 36' have central substantially circular portions and radially elongated or dovetailed portions extending from the circular portions in diametrically opposite directions and terminating at the perimeters of the quartz crystal plate 31 on its opposite principal surfaces 32 and 32', respectively, as best seen in FIG. 4A. The patterns of the recesses 36 and 36' as above described are, however, merely by way of example and thus the recesses may be so contoured as to have any other pattern such as triangular, rectangular or square pattern where desired. Such varied patterns of the recesses 36 and 36' are permissible because of the fact that the condition $d_1/t<15$ can be readily met by selecting the diameter $\phi_1$ of the quartz crystal plate 31 within a range of 5 to 8 mm since the frequency fo previously defined is set to be higher than 15MHz. For the formation of the recesses 36 and 36', a photoetching method which is in itself known may be utilized to advantage as will be described in more detail.

The recesses 36 and 36' thus formed in the quartz crystal plate 31 receive in their central portions central electrodes 33 and 33', respectively. These central electrodes 33 and 33' are herein shown as having circular configurations which are substantially identical with the patterns of the central portions of the recesses 36 and 36'. This, however, is for the purpose of illustration only and as such the external contours of the central electrodes 33 and 33′ may be varied in any desired manner insofar as they are patterned substantially in agreement with the particular configurations of the central portions of the recesses 36 and 36′ on both sides of the quartz crystal plate 31 for the very reason previously set forth. The thickness and density of the central electrodes 33 and 33′ are assumed to be $t_2$ and $\rho_2$, respectively, and, where the central electrodes have the circular patterns as shown, the diameter thereof is assumed to be $\phi^2$.

In the radially elongated or dovetailed portions of the recesses 36 and 36′ are received elongated or dovetailed lead electrodes 34 and 34′, respectively, which are directly connected to or integral with the central electrodes 33 and 33′, respectively, for providing electrical connections between these central electrodes and external circuit elements cooperating with the quartz crystal resonator 30. Similarly to the central electrodes 33 and 33′, these elongated lead electrodes 34 and 34′ have a thickness $t_2$ and a density $\rho_2$.

The elongated lead electrodes 34 and 34′ are shown as extending in diametrically opposed directions which may preferably by in alignment with the X-axis of the crystal plate 31 but, where desired, the lead electrodes 34 and 34′ may be mounted and accordingly the recess portions receiving the lead electrodes formed in any direction.

Figure 5:
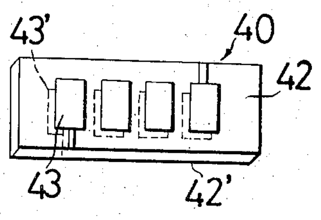
FIG. 5 is a perspective view showing another preferred embodiment of the quartz crystal resonator according to the present invention.

Although, moreover, the quartz crystal resonator 30 is herein shown as using a pair of electrodes 33 and 33′ mounted on the quartz crystal plate 31, such is by way of example only and thus a suitable number of electrodes may be positioned on each of the major surfaces of the crystal plate where desired. FIG. 5 illustrates an embodiment of the quartz crystal resonator which is constructed to this effect. Referring to FIG. 5, the modified quartz crystal resonator, generally designated by reference numeral 40, includes a substantially rectangular quartz crystal plate 41 having opposite major surfaces 42 and 42′ having a common area. Four separate recesses (not numbered) are formed in these principal surfaces 42 and 42′ and are juxtaposed in a row form as shown. One set of electrodes 43 are received in the recesses on one mg major surface 42 and the other set of electrodes 43′ are received in the recesses on the other major surface 42′. These electrodes 43 and 43′ are herein shown as having substantially rectangular patterns. The electrodes 43 and 43′ are connected to the external circuit elements through lead electrodes which are also received in the recesses formed on both sides of the quartz crystal plate 41 and which are shaped in suitable patterns.

The recesses in the quartz crystal plate of the quartz crystal resonator according to the present invention is formed advantageously in a photo-etching method using a suitable fluoride such as a supersaturated solution of ammonia fluoride or acid ammonium fluoride or hydrofluoric acid. For this purpose, a suitably cut and shaped quartz crystal plate is first prepared and is thereafter have its opposite major surfaces uniformly coated with a suitable photo-resist material which is resistant to the attack of the fluoride. An example of the photo-resist material may be the one which is commercially known under the trade name of Kodack Metal Etching Resist. The resultant coatings of the photo-resist material formed on both sides of the quartz crystal plate are then sufficiently prebaked. A transparent thin film carrying thereon an opaque pattern which is in agreement with the desired pattern of the recesses to be formed in the quartz crystal plate is superposed on the surface of each of the pre-baked photoresist coatings. The photo-resist coatings are then irradiated with light through the respective transparent thin films so that the areas of the coatings lying underneath the transparent portions of the thin film are exposed to the light with the remaining portions masked by the opaque patterns. The quartz crystal plate is thereafter immersed together with the cured photo-resist coatings in a suitable organic solution such as a mixed solution of trichloroethylene, toluene, acetone and acetic acid for thereby removing the uncured photo-resist material from those areas of the major surfaces of the quartz crystal plate which have not been exposed to the irradiation of the light in the preceding step. The coatings of the photo-baked and quartz crystal plate thus having the post-baked photo-resist coatings is immersed in an etchant bath so that the quartz crystal plate is etched over its areas which are void of the photo-resist coatings. The etching time should be controlled to have the quartz crystal plate etched to a predetermined depth. The photo-resist material remaining on the major surfaces of the quartz crystal plate thus formed with the recesses on both sides thereof is removed and the electrodes having configurations in agreement with the recesses are mounted therein.

In carrying out the above described photo-etching process, only one of the major surfaces carrying the photo-resist coatings may be irradiated with the light for the formation of the photo-resist patterns on both sides of the crystal plate. This is because of the fact that the quartz crystal plate is substantially transparent particularly where the plate has mirror-finished principal surfaces. If the quartz crystal plate has somewhat dull or whitish surfaces which may be finished to about 0.6 micron roughness for instance, the crystal plate can be still substantially transparent if the wave length of the light rays used is properly selected. Thus, the photo-resist patterns are formed on both major surfaces of the quartz crystal plate simultaneously and over the same areas in a single light irradiating step. This will considerably contribute to simplifying the process of fabricating the quartz crystal resonator and to uniforming the quality of the resonators produced on a commercial basis.

If, now, the ratio of the quantity of mass of the electrodes on the quartz crystal plate to the quantity of mass of the crystal plate is R″ and the natural frequency of the thickness shear mode of vibrations caused between the electrodes is $fe''$, they are given in the forms of $$R'' = 2\rho_2.t_2/\rho_1.t_4$$

and

Eq. 11

$$fe'' = P/2.t_4(2 + R''). \sqrt{C_{66'}\ /\rho_1}.$$

Eq. 12

The frequency drop Δ″ caused by the existence of the electrodes is therefore written $$\Delta'' = R'' + (1 - t_1/t_4)/1 + R''.$$

Eq. 13

The depth δt of each of the recesses formed on both sides of the quartz crystal plate is apparently given by $$\delta t = (t_1 - t_4)/2.$$

Eq. 14

From Eqs. 2 and 12, there results $$fo/fe'' = t_4/t_1\ (1 + 2\rho_2.t_2/\rho_1.t_4)$$

Eq. 15

Substituting Eq. 14 in the above mentioned inequality, there results $$\delta t > P_2/P_1.t_2$$

It therefore follows that the energy trapping vibrations are brought about in the particular region of the quartz crystal plate which is located underneath and intermediate between the electrodes on both surfaces of the plate.

Substituting then Eqs. 11 and 14 to Eq. 13, the frequency drop $\Delta''$ can be re-written in the form of $$\Delta'' = (\rho_2.t_2 - \rho_1.\delta t)/(\rho_2.t_2 + (1/2)\ \rho_1.t_4).$$

Eq. 16

This Eq. 16 tells that the frequency drop $\Delta''$ can be substantially arbitarily reduced through proper selection of the values $\rho_1$, $\rho_2$, $t_2$ and δt. As a consequence, the value $\phi_2$ in the parameter $P(\phi_2/t_1)\ \sqrt{\Delta''}$ can be made considerably large insofar as such parameter assumes a value smaller than 2 so that the inharmonic response of the quartz crystal resonator can be suppressed effectively. An experiment was conducted with a quartz crystal resonator using an At-cut quartz crystal plate of thickness of 83 microns and having a fundamental resonance frequency of 20 MHz. The quartz crystal resonator was excited at an overtone frequency of 60MHz with P set at 3 and $\delta t/t_1$ at 0.2%. The experiment revealed that (1) no significant increase was displayed in an equivalent resistance in the main vibrations in the third-degree overtone mode with the value $\delta t/t_1$ set at 0.2% but (2) an appreciable change was invited in the temperature characteristics of the quartz crystal resonator when the value $\delta t$ was made slightly larger than zero remained substantially unchanged. Where the depth $\delta t$ of the recesses in the quartz crystal plate is so large as to affect the temperature characteristics of the quartz crystal resonator, the cut angle of the quartz crystal plate should be adjusted in a manner to compensate for such an influence on the temperature characteristics. It is, in any event, necessary that the frequency drop Δ be increased as the values $fo$ and $P$ increase so that the thickness $t_2$ and diameter $\phi_2$ of the central electrodes should be set at largest possible values within permissible limits and at the same time the density $\rho_2$ of the electrodes be selected to be relatively small.

It is, furthermore, noted that the lead electrodes on the opposite surfaces of the quartz crystal plate are not in registry with each other so that the natural resonance frequency $fe'''$ occuring in the regions of the quartz crystal plate underneath these electrodes is higher than the natural frequency $fo$ of the crystal plate, thus $fo < fe'''$. This means that the vibration energy generated in these particular regions is not trapped and thus extinguished, advantageously over those quartz crystal plates which are void of the etched recesses. These the thickness $t_2$ of the central electrodes is selected to the smallest possible value, problems will arise in the connection and holding of the lead electrodes although the central electrodes per se are free from such problems. If, for one thing, electrodes made of a plastic conducting paint are used, there will be a risk of the metal film being absorbed in such a paint and consequently broken into pieces. This may be avoided through use of a quartz crystal plate thickened at its regions to contact the lead electrodes or, if necessary, by forming the end portions of the lead electrodes by a double evaporation method.

It will now be appreciated from the foregoing description that, since the recesses are formed in the particular areas of the major surfaces of the quartz crystal plate to receive the central and lead electrodes in a manner that the relation $t_4 + 2t_2 < t_1$ is maintained, the energy of the main vibrations can be trapped at increased frequencies and a relatively large Q-factor can be achieved in the quartz crystal plate so that the spurious response can be sufficiently suppressed. The various restrictions resulting from the limitations of the thickness $\phi_2$ of the electrodes and the frequency drop Δ caused by the very existence of the electrodes as thus far encountered in high-frequency thickness shear mode of vibrations can be practically completely eliminated in the quartz crystal resonator according to the present invention.

Since, moreover, the photo-etching method is used in forming the recesses in the quartz crystal plate, clear-cut contours of the recesses can be achieved and accordingly stabilized performannce characteristics of the quartz crystal resonator maintained during use of the resonator. The photo-etching method also permits formation of the photo-cured layers on both sides of the quartz crystal plate by irradiating the photo-resist coating on only one side of the plate during fabrication of the quartz crystal resonator according to the present invention. In spite of the provision of the recesses in the quartz crystal plate, substantially no deterioration of the temperature and aging characteristics is invited in the main vibrations of the crystal plate. Such deterioration does not result even though the quartz crystal plate is locally thickned thickened in the regions receiving the lead electrodes.

What is claimed is:

1. A quartz crystal resonator comprising, in combination, a quartz crystal plate having a density $\rho_1$ and a thickness $t_1$, said quartz crystal plate having a first major surface formed with a recess of depth $\delta_t$, said first recess having a central portion and an elongated portion extending from said central portion and terminating at the perimeter of said first major surface, said quartz crystal plate further having a second major surface parallel to said first major surface and formed with a second recess having a depth substantially equal to the depth of said first recess, said second recess having a central portion in registry with said central portion of said first recess and an elongated portion extending from said central portions in a direction opposite to the direction of said elongated portion of said first recess, said second recess terminating at the perimeter of said second major surface; and first and second electrode layers respectively placed in said first and second recesses and having substantially the same thickness $t_2$ and the same density $\rho_2$, said depth of said first and second recesses, said thickness of said electrode layers, and said densities satisfying the inequality:

$$\delta t > \rho_2/\rho_1\ t_2.$$

2. A quartz crystal resonator a set forth in claim 1, wherein said electrode layers are conformingly received in said elongated portions of said first and second recesses.

3. A quartz crystal resonator as set forth in claim 1, wherein said first and second recesses are photo-etched recesses.

4. Method of manufacturing a quartz crystal resonator consisting of a quartz crystal plate formed with recesses and electrode layer s mounted in said recesses, comprising, in combination, the steps of first manufacturing a partially processed quartz crystal plate having a first and second major surface each having exposed portions of a determined shape for receiving said electrode layers and additional portions carrying a coating; immersing said partially processed quartz crystal plate in an etchant for etching recesses of a predetermined depth in said exposed portions, said predetermined depths exceeding the product of the thickness of said electrode layers multiplied by the ratio of the density of said electrode layers to the density of said quartz crystal plate; removing said quartz crystal plate from said etchant and removing said coating from said additional portions; and mounting said electrode layers in said recesses.

5. Method as set forth in claim 4, wherein said step of first manufacturing a partially processed quartz crystal plate comprises the steps of preparing a quartz crystal plate having a cut angle providing a determined mode of vibration; coating opposite major surfaces of said quartz crystal plate with a photo-resist material, thereby creating coatings; masking predetermined portions of said coatings to create masked portions having said determined shape for receiving said electrode layers, and unmasked portions; irradiating said unmasked portions until said unmasked portions are cured; immersing said quartz crystal plate carrying said coatings in a selective solvent for dissolving uncured photoresist material, thereby creating said exposed portions; and post-baking said quartz crystal plate having said exposed portions.

6. Method as set forth in claim 5, wherein said step of masking predetermined portions comprises the step of superposing a substantially transparent thin film carrying thereon an opaque pattern having said determined shapr for receiving said electrode layers upon at least one of said coatings; and wherein said step of irradiating said unmasked portions comprises the step of irradiating said coatings through said film.

7. Method as set forth in claim 5, wherein said determined mode of vibration is the thickness shear mode.

* * * * *